United States Patent
Yu et al.

(10) Patent No.: US 10,014,213 B2
(45) Date of Patent: Jul. 3, 2018

(54) SELECTIVE BOTTOM-UP METAL FEATURE FILLING FOR INTERCONNECTS

(71) Applicant: Tokyo Electron Limited, Minato-ku, Tokyo (JP)

(72) Inventors: Kai-Hung Yu, Watervliet, NY (US); Kandabara N. Tapily, Mechanicville, NY (US); Robert D. Clark, Livermore, CA (US); Gerrit J. Leusink, Rexford, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/293,902

(22) Filed: Oct. 14, 2016

(65) Prior Publication Data
US 2017/0110368 A1 Apr. 20, 2017

Related U.S. Application Data

(60) Provisional application No. 62/242,167, filed on Oct. 15, 2015.

(51) Int. Cl.
| | |
|---|---|
| H01L 21/768 | (2006.01) |
| H01L 23/522 | (2006.01) |
| H01L 23/528 | (2006.01) |
| H01L 23/532 | (2006.01) |

(52) U.S. Cl.
CPC .. *H01L 21/76879* (2013.01); *H01L 21/76816* (2013.01); *H01L 21/76826* (2013.01); *H01L 21/76876* (2013.01); *H01L 23/528* (2013.01); *H01L 23/5226* (2013.01); *H01L 23/53209* (2013.01); *H01L 23/53214* (2013.01); *H01L 23/53242* (2013.01)

(58) Field of Classification Search
CPC combination set(s) only.
See application file for complete search history.

(56) References Cited

U.S. PATENT DOCUMENTS

| | | |
|---|---|---|
| 2009/0250815 A1 | 10/2009 | Yang et al. |
| 2009/0272965 A1 | 11/2009 | Rachmady et al. |

(Continued)

OTHER PUBLICATIONS

Korean Intellectual Property Office, International Search Report and Written Opinion for International Application No. PCT/US2016/057181, dated Jan. 10, 2017, 13 pages.

*Primary Examiner* — Mamadou Diallo

(57) ABSTRACT

A method for selective bottom-up filling of recessed features with a low resistivity metal for semiconductor devices is described in several embodiments. The method includes providing a substrate containing a patterned dielectric layer having a recessed feature with dielectric layer surfaces and a metal-containing surface on a bottom of the recessed feature, reacting the dielectric layer surfaces with a reactant gas containing a hydrophobic functional group to form hydrophobic dielectric layer surfaces, and at least substantially filling the recessed feature with a metal in a bottom-up gas phase deposition process that hinders deposition of the metal on the hydrophobic dielectric layer surfaces. According to one embodiment, the metal is selected from the group consisting of ruthenium (Ru), cobalt (Co), aluminum (Al), iridium (Ir), iridium (Ir), rhodium (Rh), osmium (Os), palladium (Pd), platinum (Pt), nickel (Ni), and a combination thereof.

16 Claims, 2 Drawing Sheets

(56) References Cited

U.S. PATENT DOCUMENTS

| | | | |
|---|---|---|---|
| 2010/0248473 A1* | 9/2010 | Ishizaka | H01L 21/02063 438/659 |
| 2011/0285021 A1 | 11/2011 | Yang et al. | |
| 2012/0153502 A1* | 6/2012 | Price | H01L 21/7688 257/774 |
| 2013/0337236 A1 | 12/2013 | Imec | |
| 2015/0170961 A1* | 6/2015 | Romero | H01L 21/76838 438/641 |
| 2016/0178568 A1* | 6/2016 | Cheng | G01N 27/4145 257/253 |

* cited by examiner

SELECTIVE BOTTOM-UP METAL FEATURE FILLING FOR INTERCONNECTS

CROSS-REFERENCE TO RELATED APPLICATIONS

This application is related to and claims priority to U.S. Provisional Patent Application Ser. No. 62/242,167 filed on Oct. 15, 2015, the entire contents of which are herein incorporated by reference.

FIELD OF INVENTION

The present invention relates to methods for semiconductor manufacturing, and in particular to methods for bottom-up filling of recessed features with a low resistivity metal for semiconductor devices.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other.

Normally, each metal layer must form an electrical contact to at least one additional metal layer. Such electrical contact is achieved by etching a feature (i.e., a via) in the interlayer dielectric that separates the metal layers, and filling the resulting via with a metal to create an interconnect. Metal layers typically occupy etched pathways in the interlayer dielectric. A "via" normally refers to any feature such as a hole, line or other similar feature formed within a dielectric layer that provides an electrical connection through the dielectric layer to a conductive layer underlying the dielectric layer. Similarly, metal layers connecting two or more vias are normally referred to as trenches.

The use of copper (Cu) metal in multilayer metallization schemes for manufacturing integrated circuits creates problems due to high mobility of Cu atoms in dielectrics, such as $SiO_2$, and Cu atoms may create electrical defects in Si. Thus, Cu metal layers, Cu filled trenches, and Cu filled vias are normally encapsulated with a barrier material to prevent Cu atoms from diffusing into the dielectrics and Si. Barrier layers are normally deposited on trench and via sidewalls and bottoms prior to Cu seed deposition, and may include materials that are preferably non-reactive and immiscible in Cu, provide good adhesion to the dielectrics and can offer low electrical resistivity.

An increase in device performance is normally accompanied by a decrease in device area or an increase in device density. An increase in device density requires a decrease in via dimensions used to form interconnects, including a larger aspect ratio (i.e., depth to width ratio). As via dimensions decrease, and aspect ratios increase, it becomes increasingly more challenging to form diffusion barrier layers with adequate thickness on the sidewalls of the vias, while also providing enough volume for the metal layer in the via. In addition, as via and trench dimensions decrease and the thicknesses of the layers in the vias and trenches decrease, the material properties of the layers and the layer interfaces become increasingly more important. In particular, the processes forming those layers need to be carefully integrated into a manufacturable process sequence where good control is maintained for all the steps of the process sequence.

The problems associated with the use of Cu metal in increasingly smaller features on a substrate will require replacing the Cu metal with other low-resistivity metals.

SUMMARY OF THE INVENTION

A method for selective bottom-up filling of recessed features with a low resistivity metal for semiconductor devices is described in several embodiments.

According to one embodiment, the method includes providing a substrate containing a patterned dielectric layer having a recessed feature with dielectric layer surfaces and a metal-containing surface on a bottom of the recessed feature, reacting the dielectric layer surfaces with a reactant gas containing a hydrophobic functional group to form hydrophobic dielectric layer surfaces, and at least substantially filling the recessed feature with a metal in a bottom-up gas phase deposition process that hinders deposition of the metal on the hydrophobic dielectric layer surfaces. According to one embodiment, the metal is selected from the group consisting of ruthenium (Ru), cobalt (Co), aluminum (Al), iridium (Ir), rhodium (Rh), osmium (Os), palladium (Pd), platinum (Pt), nickel (Ni), and a combination thereof.

According to another embodiment, the method includes providing a substrate containing a patterned dielectric layer having a recessed feature with dielectric layer surfaces and a metal-containing surface on a bottom of the recessed feature, reacting the dielectric layer surfaces with a silicon-containing reactant gas containing a hydrophobic functional group to form hydrophobic dielectric layer surfaces, and at least substantially filling the recessed feature with ruthenium (Ru) metal in a bottom-up gas phase deposition process that hinders deposition of the Ru metal on the hydrophobic dielectric layer surfaces, where the Ru metal is deposited in a chemical vapor deposition process using a deposition gas containing $Ru_3(CO)_{12}$ precursor vapor and CO carrier gas.

According to another embodiment, the method includes providing a substrate containing a patterned dielectric layer having a recessed feature with dielectric layer surfaces and a metal-containing surface on a bottom of the recessed feature, reacting the dielectric layer surfaces with a silicon-containing reactant gas containing a hydrophobic functional group to form hydrophobic dielectric layer surfaces, and at least substantially filling the recessed feature with cobalt (Co) metal in a bottom-up gas phase deposition process that hinders deposition of the Co metal on the hydrophobic dielectric layer surfaces, where the Co metal is deposited in a chemical vapor deposition process using a deposition gas containing a Co-containing precursor vapor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1:
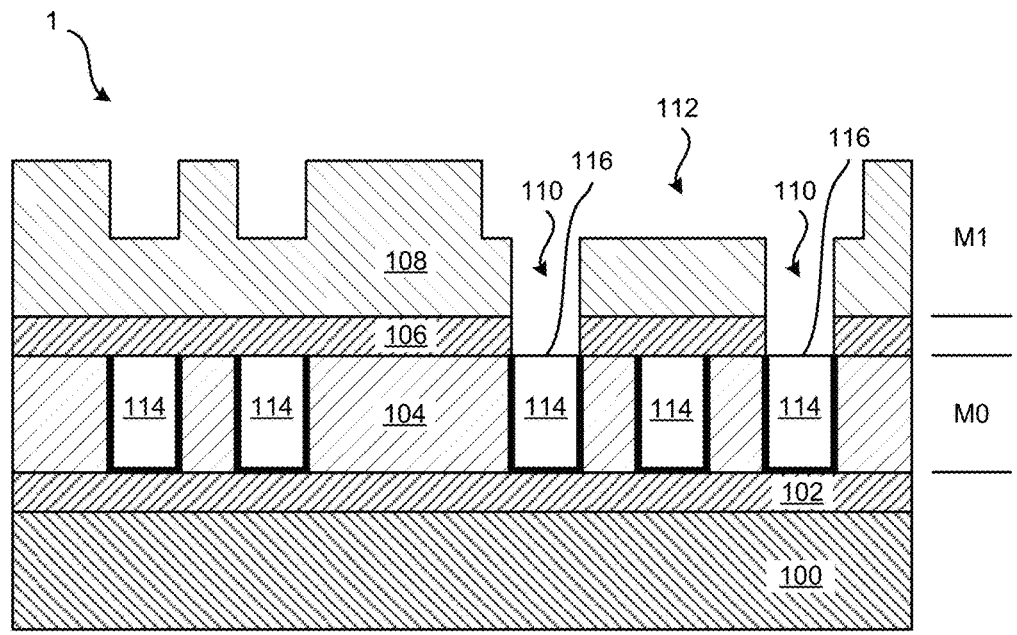
FIG. 1 schematically shows a cross-sectional view of an exemplary semiconductor device according to an embodiment of the invention.

A method for selective bottom-up filling of recessed features with a low resistivity metal for semiconductor devices is described in several embodiments.

According to one embodiment, the method includes providing a substrate containing a patterned dielectric layer having a recessed feature with dielectric layer surfaces and a metal-containing surface on a bottom of the recessed feature, reacting the dielectric layer surfaces with a reactant gas containing a hydrophobic functional group to form hydrophobic dielectric layer surfaces, and at least substantially filling the recessed feature with a metal in a bottom-up gas phase deposition process that hinders deposition of the metal on the hydrophobic dielectric layer surfaces.

According to one embodiment, the recessed feature may be completely filled with the metal. According to one embodiment, the recessed feature may be overfilled with the metal and thereafter a planarization process (e.g., chemical mechanical polishing (CMP)) may be performed that removes excess metal from above the recessed feature.

It has been shown that Ru metal, with its short effective electron mean free path, is an excellent candidate to meet the International Technology Roadmap for Semiconductors (ITRS) resistance requirements as a Cu metal replacement at about 10 nm (5 nm node) minimum recessed feature sizes. Due to many material and electric properties of Ru metal, it is less affected by downward scaling of feature sizes than Cu metal.

The recessed feature in the dielectric layer can, for example, include a trench and/or a via. The recessed feature diameter can, for example, be less than 30 nm, less than 20 nm, less than 10 nm, or less than 5 nm. The recessed feature diameter can, for example, be between 20 nm and 30 nm, between 10 nm and 25 nm, between 5 nm and 10 nm, or between 3 nm and 5 nm. A depth of the recessed feature can, for example, be greater 10 nm, greater 20 nm, greater than 50 nm, greater than 100 nm, or greater than 200 nm. The recessed features can, for example, have an aspect ratio (AR, depth:width) between 2:1 and 20:1, between 2:1 and 10:1, or between 2:1 and 5:1.

The dielectric layer can, for example, contain $SiO_2$, a low-k dielectric material, or a high-k dielectric material. Low-k dielectric materials have a nominal dielectric constant less than the dielectric constant of $SiO_2$, which is approximately 4 (e.g., the dielectric constant for thermally grown silicon dioxide can range from 3.8 to 3.9). High-k dielectric materials have a nominal dielectric constant greater than the dielectric constant of $SiO_2$.

Some low-k dielectric materials have a dielectric constant of less than 3.7, or a dielectric constant ranging from 1.6 to 3.7. Low-k dielectric materials can include fluorinated silicon glass (FSG), carbon doped oxide, a polymer, SiCOH-containing low-k material, non-porous low-k material, porous low-k material, spin-on dielectric (SOD) low-k material, or any other suitable dielectric material. Low-k dielectric materials include porous inorganic-organic hybrid films comprised of a single-phase, such as a silicon oxide-based matrix having $CH_3$ bonds that hinder full densification of the film during a curing or deposition process to create small voids (or pores). Further, these dielectric layers may include porous inorganic-organic hybrid films comprised of at least two phases, such as a carbon-doped silicon oxide-based matrix having pores of organic material (e.g., porogen) that is decomposed and evaporated during a curing process.

In addition, low-k materials include silicate-based materials, such as hydrogen silsesquioxane (HSQ) or methyl silsesquioxane (MSQ), deposited using SOD techniques. Examples of such films include FOx® HSQ commercially available from Dow Corning, XLK porous HSQ commercially available from Dow Corning, and JSR LKD-5109 commercially available from JSR Microelectronics.

FIG. 1 schematically shows a cross-sectional view of an exemplary semiconductor device according to an embodiment of the invention. The partially manufactured device 1 contains multiple dielectric layers containing recessed features that are filled or to be filled with a metal. The partially manufactured device 1 contains a $SiO_2$ layer 100, a first blanket NMLoK ($SiC_xN_yH_z$) dielectric layer 102, a first interlayer dielectric layer 104, a second blanket NMLoK ($SiC_xN_yH_z$) dielectric layer 106, a second interlayer dielectric layer 108, and metal plugs 114 in the first interlayer dielectric layer 104 that are a part of the M0 metallization level. The partially manufactured device 1 contains a M1 metallization level with recessed features (vias 110 and trench 112) to be filled with a metal, and connecting the metal to the metal layers 114. In the exemplary partially manufactured semiconductor device 1, the vias 110 contain exposed metal-containing surfaces 116 of the metal layers 114 in the M0 metallization level below the M1 metallization level. In some examples, the metal-containing surfaces 116 can contain copper (Cu), tungsten (W), ruthenium (Ru), cobalt (Co), titanium nitride (TiN), tantalum nitride (TaN), or combinations thereof. According to some embodiments of the invention, a metal that is used to fill the recessed features 110, 112 may be selected from the group consisting of ruthenium (Ru), cobalt (Co), aluminum (Al), iridium (Ir), rhodium (Rh), osmium (Os), palladium (Pd), platinum (Pt), nickel (Ni), and a combination thereof. However, other low-resistance metals may be used to fill the recessed features 110, 112.

According to some embodiments of the invention, the exposed surfaces of the partially manufactured semiconductor device 1, and other similar partially manufactured semiconductor devices, may be exposed to a reactant gas containing a hydrophobic functional group, where the reactant gas substitutes a hydrophilic functional group (e.g., hydroxyl group) on surfaces of the exposed the dielectric layers with the hydrophobic functional group in the reactant gas. The presence of the hydrophobic functional group on the surfaces of the dielectric layers prevents or hinders deposition of the metal on the hydrophobic dielectric layer surfaces. The reactant gas does not react with the metal-containing surfaces 116, and thus does not prevent or hinder subsequent deposition of the metal on the metal-containing surfaces 116. This results in selective bottom-up deposition of the metal in the recessed features 110, 112.

Figure 2:
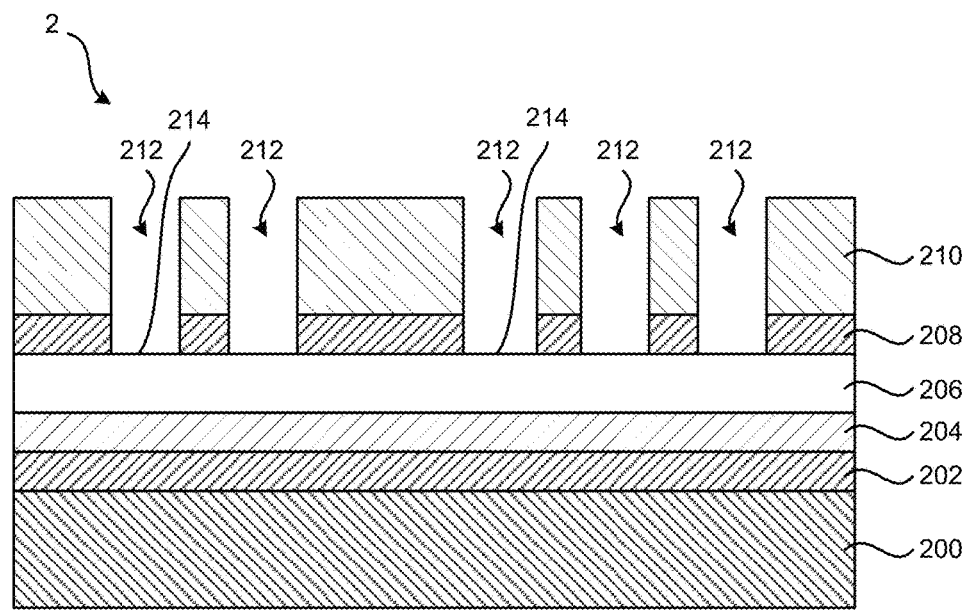
FIG. 2 schematically shows a cross-sectional view of a partially manufactured semiconductor device test structure according to an embodiment of the invention.
Figure 3:
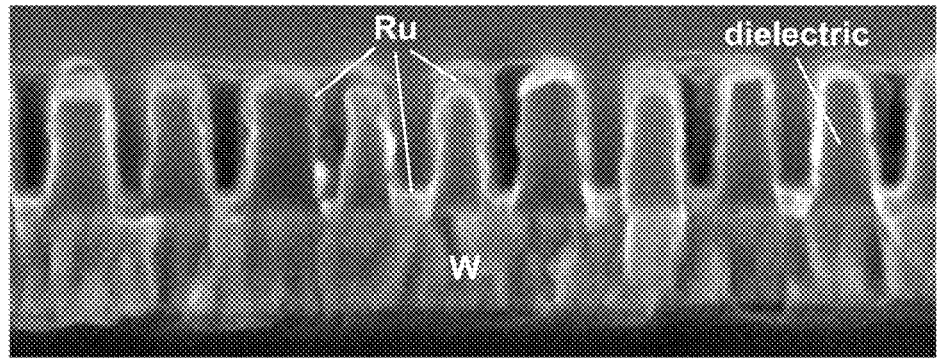
FIG. 3 shows a cross-sectional scanning electron microscope (SEM) image of non-selective Ru metal deposition on the semiconductor device test structure of FIG. 2.

FIG. 2 schematically shows a cross-sectional view of a partially manufactured semiconductor device test structure according to an embodiment of the invention. The test structure 2 was used to demonstrate bottom-up filling of Ru metal in recessed features. The test structure 2 contained a dielectric layer 200, a SiN layer 202, a TiN layer 204, a 100 nm thick W metal layer 206 with exposed W metal surfaces 214, a patterned SiN etch stop layer 208, and a patterned dielectric layer 210. The recessed features 212 in the patterned dielectric layer 210 were about 40 nm wide and about 130 nm deep (AR about 3). FIG. 3 shows a cross-sectional SEM image of non-selective Ru metal deposition on the semiconductor device test structure of FIG. 2. The Ru metal deposition utilized a deposition gas containing $Ru_3(CO)_{12}$ precursor vapor and CO carrier gas under the following processing conditions: substrate holder temperature 220° C.-250° C., process chamber pressure≤5 mTorr, and CO carrier gas flow of 100 sccm. The Ru metal deposition rate was about 5 nm/min. FIG. 3 illustrates that Ru metal was non-selectively deposited both on the W metal surface on the bottom of the recessed features as well as on the dielectric layer surfaces on the sidewalls and on the top surfaces of the dielectric material.

Figure 4:
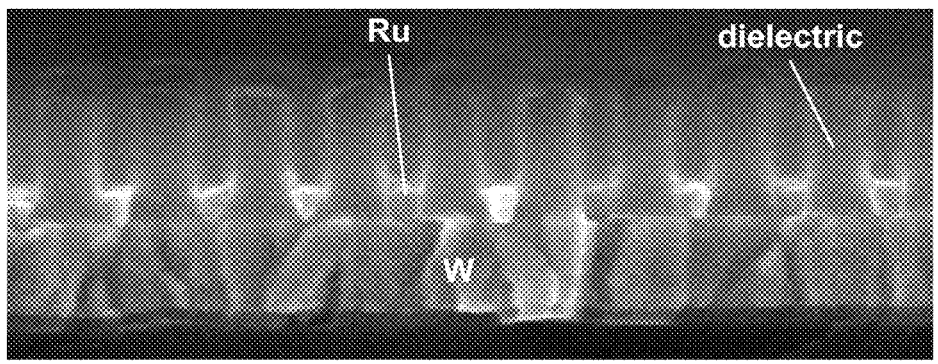
FIG. 4 shows a cross-sectional SEM image of selective bottom-up Ru metal deposition on the semiconductor device test structure of FIG. 2 following formation of hydrophobic dielectric layer surfaces according to an embodiment of the invention.

FIG. 4 shows a cross-sectional SEM image of selective bottom-up Ru metal deposition on the semiconductor device test structure of FIG. 2 following formation of hydrophobic dielectric layer surfaces according to an embodiment of the invention. The hydrophobic dielectric layer surfaces were formed by reacting the dielectric layer surfaces with a reactant gas containing a hydrophobic functional group (i.e., trimethylsilane dimethylamine (TMSDMA)). The processing conditions included a substrate holder temperature of 180° C., process chamber pressure of 5 Torr, TMSDMA/$N_2$ gas flows of 500 sccm/350 sccm, and gas exposure time of 25 seconds. FIG. 4 illustrates that Ru metal was subsequently selectively deposited on the W metal surfaces on the bottom of the recessed features but deposition of the Ru metal was hindered or prevented on the hydrophobic dielectric layer surfaces. The hydrophobic dielectric layer surfaces included the sidewalls of the recessed features in the dielectric material and the horizontal surfaces of the patterned dielectric layer around the recessed features. The thickness of the Ru metal layer on the W metal surfaces was about 34 nm, thus filling approximately 25% of the recessed features with Ru metal. According to some embodiments, the Ru metal deposition may be continued to further fill the recessed features with Ru metal. For example, the recessed features may be filled to greater than 25%, greater than 50%, greater than 75%, 100%, and greater than 100%.

A comparison of the results in FIGS. 3 and 4 shows that reacting the dielectric layer surfaces with the reactant gas provides a method for selective bottom-up metal deposition in recessed features. This provides a method for partially or fully filling the recessed features with a seam-less metal layer and reduces or eliminates the need for removing excess metal from above the metal filled recessed features.

According to some embodiments of the invention, the reactant gas can contain a silicon-containing gas, including an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof.

According to some embodiments of the invention, the reactant gas may be selected from dimethylsilane dimethylamine (DMSDMA), trimethylsilane dimethylamine (TMSDMA), bis(dimethylamino) dimethylsilane (BDMADMS), and other alkyl amine silanes. According to other embodiments, the reactant gas may be selected from N,O bistrimethylsilyltrifluoroacetamide (BSTFA) and trimethylsilyl-pyrrole (TMS-pyrrole).

According to some embodiments of the invention, the reactant gas may be selected from silazane compounds. Silazanes are saturated silicon-nitrogen hydrides. They are analogous in structure to siloxanes with —NH— replacing —O—. An organic silazane precursor can further contain at least one alkyl group bonded to the Si atom(s). The alkyl group can, for example, be a methyl group, an ethyl group, a propyl group, or a butyl group, or combinations thereof. Furthermore, the alkyl group can be a cyclic hydrocarbon group such as a phenyl group. In addition, the alkyl group can be a vinyl group. Disilazanes are compounds having from 1 to 6 methyl groups attached to the silicon atoms or having 1 to 6 ethyl groups attached the silicon atoms, or a disilazane molecule having a combination of methyl and ethyl groups attached to the silicon atoms.

According to some embodiments of the invention, the recessed features are at least substantially filled with the metal using a gas phase deposition process that includes chemical vapor deposition (CVD) or atomic layer deposition (ALD). According to one embodiment, the metal includes ruthenium (Ru) metal and the Ru metal is deposited using a deposition gas containing $Ru_3(CO)_{12}$ precursor vapor and CO carrier gas. In other examples the deposition gas can contain $Ru_3(CO)_{12}$, (2,4-dimethylpentadienyl) (ethylcyclopentadienyl) ruthenium (Ru(DMPD)(EtCp)), bis(2,4-dimethylpentadienyl) ruthenium (Ru(DMPD)$_2$), (2,4-dimethylpentadienyl) (methylcyclopentadienyl) ruthenium, or combination of two or more thereof. According to other embodiments, the metal includes cobalt (Co) metal and the Co metal may be deposited using a deposition gas containing $Co_2(CO)_8$, $Co_4(CO)_{12}$, $CoCp(CO)_2$, $Co(CO)_3(NO)$, $Co_2(CO)_6(HCC^tBu)$, $Co(acac)_2$, $Co(Cp)_2$, $Co(Me_5Cp)_2)$, $Co(EtCp)_2$, cobalt(II) hexafluoroacetylacetonate hydrate, cobalt tris(2,2,6,6-tetramethyl-3,5-heptanedionate), cobalt (III) acetylacetonate, bis(N,N'-diisopropylacetamidinato) cobalt, tricarbonyl allyl cobalt, or a combination of two or more thereof. According to other embodiments, the metal includes aluminum (Al) metal and the Al metal may be deposited using a deposition gas containing $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, $Al(THD)_3$, $H_3AlNMe_3$, $H_3AlNEt_3$, $H_3AlNMe_2Et$, $H_3AlMeEt_2$, and a combination of two or more thereof.

According to one embodiment of the invention, the metal filled recessed features may be heat-treated following the metal filling process. The heat-treating increases the grain size of the metal in the recessed feature and the large grain size of the heat-treated metal has low electrical resistance that is needed for replacing Cu metal fill in narrow recessed features. According to embodiments of the invention, the heat-treating may, for example, be performed at a substrate temperature between 200° C. and 600° C., between 300° C. and 400° C., between 500° C. and 600° C., between 400° C. and 450° C., or between 450° C. and 500° C. Further, the heat-treating may be performed at below atmospheric pressure in the presence of Ar gas, $H_2$ gas, or both Ar gas and $H_2$ gas. In one example, the heat-treating may be performed at below atmospheric pressure in the presence of forming gas. In another example, the heat-treating may be formed under high-vacuum conditions without flowing a gas into a process chamber used for the heat-treating.

Embodiments selective bottom-up metal feature filling for interconnects have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method of forming a semiconductor device, the method comprising:
providing a substrate containing a patterned dielectric layer having a recessed feature with dielectric layer surfaces and a metal-containing surface on a bottom of the recessed feature;
reacting the dielectric layer surfaces with a reactant gas containing a hydrophobic functional group to form hydrophobic dielectric layer surfaces; and
filling the recessed feature with a metal in a bottom-up gas phase deposition process that hinders deposition of the metal on the hydrophobic dielectric layer surfaces, wherein the metal is selected from the group consisting of ruthenium (Ru), cobalt (Co), aluminum (Al), iridium (Ir), rhodium (Rh), osmium (Os), palladium (Pd), platinum (Pt), nickel (Ni), and a combination thereof, and wherein the filling the recessed feature with the metal overfills the recessed feature with the metal.

2. The method of claim 1, wherein the reactant gas includes a silicon-containing gas.

3. The method of claim 2, wherein the silicon-containing gas is selected from the group consisting of an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, and a combination thereof.

4. The method of claim 2, wherein the reactant gas is selected from the group consisting of dimethylsilane dimethylamine (DMSDMA), trimethylsilane dimethylamine (TMSDMA), bis(dimethylamino) dimethylsilane (BDMADMS), N,O bistrimethylsilyltrifluoroacetamide (BSTFA), trimethylsilyl-pyrrole (TMS-pyrrole), and a combination thereof.

5. The method of claim 1, wherein the metal-containing surface contains copper (Cu), tungsten (W), ruthenium (Ru), cobalt (Co), titanium nitride (TiN), tantalum nitride (TaN), or combinations thereof.

6. The method of claim 1, wherein the metal is deposited by chemical vapor deposition (CVD) or atomic layer deposition (ALD).

7. The method of claim 1, wherein the metal includes ruthenium (Ru) metal and the Ru metal is deposited using a deposition gas containing $Ru_3(CO)_{12}$ precursor vapor and CO carrier gas.

8. The method of claim 1, wherein the metal includes ruthenium (Ru) metal and the Ru metal is deposited using a deposition gas containing $Ru_3(CO)_{12}$, (2,4-dimethylpentadienyl) (ethylcyclopentadienyl) ruthenium (Ru(DMPD) (EtCp)), bis(2,4-dimethylpentadienyl) ruthenium (Ru (DMPD)$_2$), (2,4-dimethylpentadienyl) (methylcyclopentadienyl) ruthenium, or a combination of two or more thereof.

9. The method of claim 1, wherein the metal includes cobalt (Co) metal.

10. The method of claim 1, wherein the metal includes cobalt (Co) metal and the Co metal is deposited using a deposition gas containing $Co_2(CO)_8$, $Co_4(CO)_{12}$, $CoCp(CO)_2$, $Co(CO)_3(NO)$, $Co_2(CO)_6(HCC^tBu)$, $Co(acac)_2$, $Co(Cp)_2$, $Co(Me_5Cp)_2$), $Co(EtCp)_2$, cobalt(II) hexafluoroacetylacetonate hydrate, cobalt tris(2,2,6,6-tetramethyl-3,5-heptanedionate), cobalt(III) acetylacetonate, bis(N,N'-diisopropylacetamidinato) cobalt, tricarbonyl allyl cobalt, or a combination of two or more thereof.

11. The method of claim 1, wherein a diameter of the recessed feature is between about 10 nm and about 25 nm.

12. The method of claim 1, wherein the dielectric layer includes a low-k dielectric material.

13. A method of forming a semiconductor device, the method comprising:
providing a substrate containing a patterned dielectric layer having a recessed feature with dielectric layer surfaces and a metal-containing surface on a bottom of the recessed feature;
reacting the dielectric layer surfaces with a silicon-containing reactant gas containing a hydrophobic functional group to form hydrophobic dielectric layer surfaces; and
filling the recessed feature with ruthenium (Ru) metal in a bottom-up gas phase deposition process that hinders deposition of the Ru metal on the hydrophobic dielectric layer surfaces, wherein the Ru metal is deposited in a chemical vapor deposition process using a deposition gas containing $Ru_3(CO)_{12}$ precursor vapor and CO carrier gas, wherein the filling the recessed feature with the Ru metal overfills the recessed feature with the Ru metal.

14. The method of claim 13, wherein the metal-containing surface contains copper (Cu), tungsten (W), ruthenium (Ru), cobalt (Co), titanium nitride (TiN), tantalum nitride (TaN), or combinations thereof.

15. A method of forming a semiconductor device, the method comprising:
providing a substrate containing a patterned dielectric layer having a recessed feature with dielectric layer surfaces and a metal-containing surface on a bottom of the recessed feature;
reacting the dielectric layer surfaces with a silicon-containing reactant gas containing a hydrophobic functional group to form hydrophobic dielectric layer surfaces; and
filling the recessed feature with cobalt (Co) metal in a bottom-up gas phase deposition process that hinders deposition of the Co metal on the hydrophobic dielectric layer surfaces, wherein the Co metal is deposited in a chemical vapor deposition process using a deposition gas containing a Co-containing precursor vapor, and wherein the filling the recessed feature recessed feature with the Co metal overfills the recessed feature with the Co metal.

16. The method of claim 15, wherein the deposition gas contains $Co_2(CO)_8$, $Co_4(CO)_{12}$, $CoCp(CO)_2$, $Co(CO)_3(NO)$, $Co_2(CO)_6(HCC^tBu)$, $Co(acac)_2$, $Co(Cp)_2$, $Co(Me_5Cp)_2$), $Co(EtCp)_2$, cobalt(II) hexafluoroacetylacetonate hydrate, cobalt tris(2,2,6,6-tetramethyl-3,5-heptanedionate), cobalt(III) acetylacetonate, bis(N,N'-diisopropylacetamidinato) cobalt, tricarbonyl allyl cobalt, or a combination of two or more thereof.

* * * * *